United States Patent
Kang et al.

(10) Patent No.: US 12,033,918 B2
(45) Date of Patent: Jul. 9, 2024

(54) COOLING APPARATUS

(71) Applicant: LG Magna e-Powertrain Co., Ltd., Incheon (KR)

(72) Inventors: Myeon Gyu Kang, Seoul (KR); Yong Sik Kim, Seoul (KR); Namjoon Cho, Seoul (KR)

(73) Assignee: LG Electronics Inc., Seoul (KR)

( * ) Notice: Subject to any disclaimer, the term of this patent is extended or adjusted under 35 U.S.C. 154(b) by 710 days.

(21) Appl. No.: 17/258,993

(22) PCT Filed: Jul. 9, 2018

(86) PCT No.: PCT/KR2018/007763
§ 371 (c)(1),
(2) Date: Jan. 8, 2021

(87) PCT Pub. No.: WO2020/013348
PCT Pub. Date: Jan. 16, 2020

(65) Prior Publication Data
US 2021/0280498 A1    Sep. 9, 2021

(51) Int. Cl.
*H01L 23/473* (2006.01)
*H01L 23/367* (2006.01)
(Continued)

(52) U.S. Cl.
CPC ........ *H01L 23/473* (2013.01); *H01L 23/3675* (2013.01); *H01L 25/074* (2013.01); *H01L 25/117* (2013.01); *H05K 7/20927* (2013.01)

(58) Field of Classification Search
CPC .............. H01L 23/3672; H01L 23/473; H01L 23/3675; H01L 23/4012; H01L 25/117;
(Continued)

(56) References Cited

U.S. PATENT DOCUMENTS

| 2005/0133210 A1 | 6/2005 | Inagaki et al. |
| 2006/0219396 A1 | 10/2006 | Abei et al. |

(Continued)

FOREIGN PATENT DOCUMENTS

| JP | 2006005014 | 1/2006 |
| JP | 2006287108 | 10/2006 |

(Continued)

*Primary Examiner* — Michael Carter
*Assistant Examiner* — Lawrence C Tynes, Jr.
(74) *Attorney, Agent, or Firm* — Fish & Richardson P.C.

(57) ABSTRACT

A cooling apparatus includes: a main body configured to provide a cooling water flow path in an inner space, a plurality of cooling jackets each including a plurality of cooling fins, the plurality of cooling fins being disposed inside the main body along the cooling water flow path and spaced apart from each other by a set distance, and a plurality of double-sided chip modules disposed between at least two of the plurality of cooling jackets and having an upper surface and a lower surface contacting the at least two cooling jackets. Each module of the plurality of double-sided chip modules is (i) located at a position corresponding to a position of one of the plurality of cooling fins, (ii) facing the one of the plurality of cooling fins, and (iii) spaced apart from at least one other module to simultaneously cool the upper surface and the lower surface.

19 Claims, 13 Drawing Sheets

(51) Int. Cl.
*H01L 25/07* (2006.01)
*H01L 25/11* (2006.01)
*H05K 7/20* (2006.01)

(58) Field of Classification Search
CPC ........... H01L 25/074; H01L 2023/4075; H01L 2023/4081; H01L 2023/4087; H01L 2023/4093; H05K 7/20927
See application file for complete search history.

(56) References Cited

U.S. PATENT DOCUMENTS

| | | |
|---|---|---|
| 2009/0008061 A1 | 1/2009 | Inagaki et al. |
| 2011/0299265 A1* | 12/2011 | Nakatsu ................ H01L 25/072 361/820 |
| 2012/0087095 A1* | 4/2012 | Tokuyama ............ H01L 23/467 361/720 |
| 2013/0003301 A1 | 1/2013 | Miyamoto et al. |
| 2016/0211192 A1 | 7/2016 | Mizuno et al. |
| 2018/0240735 A1* | 8/2018 | Karidis ............... H01L 23/3677 |
| 2018/0332739 A1* | 11/2018 | Takeuchi ............. H01L 23/473 |
| 2019/0341327 A1* | 11/2019 | Teysseyre ........... H01L 23/3735 |

FOREIGN PATENT DOCUMENTS

| | | |
|---|---|---|
| JP | 2010010418 | 1/2010 |
| JP | 2015050232 | 3/2015 |
| JP | 201857187 | 4/2018 |

\* cited by examiner

COOLING APPARATUS

CROSS-REFERENCE TO RELATED APPLICATIONS

This application is a National Stage application under 35 U.S.C. § 371 of International Application No. PCT/KR2018/007763, having an International Filing Date of Jul. 9, 2018. The disclosure of the prior applicant is considered part of the disclosure of this application, and is incorporated in its entirety into this application.

TECHNICAL FIELD

The present disclosure relates to a cooling apparatus for a double-sided chip module.

BACKGROUND

Interests in electric vehicles (EVs) and hybrid vehicles (HVs) are increasing to meet recently strengthened automotive carbon dioxide emission regulations.

However, when an electric vehicle is operated using other vehicle platforms, space constraints are a biggest problem.

In particular, as an inverter is mounted in a cramped engine room, the inverter needs to be as small as possible.

The size of the inverter is determined by the power module used.

Therefore, the power module needs to be designed to drive an electric drivetrain with efficient power supply and have a smallest size.

In this case, the size of the power module is determined based on power consumption of an internal power chip and cooling performance to maintain a chip temperature to be below a set temperature.

A conventional power conversion device includes a flow path in a plate through which refrigerant flows in the cooling plate. Therefore, heat exchange may be performed between the refrigerant flowing in the flow path in the plate and an electronic component, and the electronic component may be cooled effectively.

Another conventional power conversion device includes a communication cooling tube and a separation cooling tube. As the refrigerant flows through the separation cooling tube, an amount of refrigerant is increased to improve a cooling efficiency thereof.

However, for the conventional power conversion devices, there may be a problem in that the flow path along which the refrigerant flows is simply opened, and thus, the cooling performance may differ depending on local positions within the flow path. In addition, the conventional power conversion devices have a disadvantage in that the conventional power conversion devices have difficulties in compression-deforming in a predetermined direction and are not suitable for a structure using double-sided chip modules disposed on various layers.

SUMMARY

The present disclosure is directed to a cooling apparatus having a structure suitable for cooling a double-sided chip module in a miniaturized inverter and having improved cooling performance.

The present disclosure further provides a cooling apparatus having a structure capable of vertical compressive deformation.

According to one aspect of the subject matter described in this application, a cooling apparatus includes a main body including an upper plate and a lower plate that are joined to each other, the main body being configured to provide a cooling water flow path in an inner space between the upper plate and the lower plate, a plurality of cooling jackets each including a plurality of cooling fins, the plurality of cooling fins being (i) disposed inside the main body along the cooling water flow path, (ii) spaced apart from each other by a set distance, and (iii) joined between the upper plate and the lower plate, and a plurality of double-sided chip modules disposed between at least two of the plurality of cooling jackets and having an upper surface and a lower surface contacting the at least two cooling jackets. Each module of the plurality of double-sided chip modules can (i) be located at a position corresponding to a position of one of the plurality of cooling fins, (ii) face the one of the plurality of cooling fins, and (iii) be spaced apart from at least one other module among the plurality of double-sided chip modules to simultaneously cool the upper surface and the lower surface.

Implementations according to this aspect can include one or more of the following features. For example the upper plate can include a first flat portion defined along an edge thereof and a first convex portion that is convex upward around the first flat portion, the lower plate can include a second flat portion that is defined along an edge of the lower plate and that faces and contacts the first flat portion, and a second convex portion that is symmetrical with the first convex portion and that is convex downward, and the first flat portion and the second flat portion can be braze-joined and the cooling water flow path is provided between the first convex portion and the second convex portion.

In some implementations, the cooling water flow path can include a main flow path having a constant height and a rectangular cross-sectional shape, and the cooling fin can be inserted into the main flow path. In some examples, the cooling apparatus can further include a flow inhibitor that is disposed on at least one end of a flow cross-section of the cooling water flow path to block a cooling water flow, and the flow inhibitor can be disposed within each of separation distances of the plurality of cooling fins.

In some implementations, the at least two cooling jackets vertically facing the plurality of double-sided chip modules can have longitudinal ends communicating with each other to flow a cooling water. In some examples, the at least two cooling jackets vertically facing the plurality of double-sided chip modules can be vertically assembled in a slidable manner at the longitudinal ends to block communicating portions thereof.

In some examples, a number of the plurality of cooling fins can correspond to a number of the plurality of double-sided chip modules, and each of the plurality of cooling fins faces one of the plurality of double-sided chip modules. In some examples, each of the plurality of cooling fins can have a shape corresponding to a planar shape of one of the double-sided chip modules and can have an area with a size corresponding to a plane size of the one of the double-sided chip modules.

In some implementations, the cooling fin can have a wave shape. In some examples, the wave shape of the cooling fin can include a first corrugated shape in a cross-sectional direction of the cooling water flow path and a second corrugated shape in a longitudinal direction of the cooling water flow path. In some examples, the wave shape of the cooling fin can be compression-deformed within a predetermined range based on an external force being applied to the upper plate and the lower plate in a height direction.

In some implementations, the cooling jacket can include a first cooling jacket including a first main body and a plurality of first cooling fins, the first main body including a first upper plate and a first lower plate joined to each other and configured to provide a first cooling water flow path between the first upper plate and the first lower plate, and the plurality of first cooling fins disposed along the first cooling water flow path, spaced apart from each other, and joined between the first upper plate and the first lower plate, a second cooling jacket stacked on the first cooling jacket and including a second main body and a plurality of second cooling fins, the second main body including a second upper plate and a second lower plate joined to each other and configured to provide a second cooling water flow path between the second upper plate and the second lower plate, and the plurality of second cooling fins disposed along the second cooling water flow path, spaced apart from each other, and joined between the second upper plate and the second lower plate, and a third cooling jacket stacked on the second cooling jacket and including a third main body and a plurality of third cooling fins, the third main body including a third upper plate and a third lower plate joined to each other and configured to provide a third cooling water flow path between the third upper plate and the third lower plate, and the plurality of third cooling fins disposed along the third cooling water flow path, spaced apart from each other, and joined between the third upper plate and the third lower plate.

In some examples, the double-sided chip module can include a plurality of first double-sided chip modules disposed between the first cooling jacket and the second cooling jacket and having an upper surface and a lower surface contacting the first cooling jacket and the second cooling jacket, each module of the plurality of first double-sided chip modules provided at a position corresponding to a position of each of the plurality of first cooling fins and the plurality of second cooling fins and facing the corresponding first cooling fin and the corresponding second cooling fin, and a plurality of second double-sided chip modules disposed between the second cooling jacket and the third cooling jacket and having an upper surface and a lower surface contacting the second cooling jacket and the third cooling jacket, each module of the plurality of second double-sided chip modules provided at a position corresponding to a position of each of the plurality of second cooling fins and the plurality of third cooling fins and facing the corresponding second cooling fin and the corresponding third cooling fin.

In some implementations, the first cooling jacket, the second cooling jacket, and the third cooling jacket can have longitudinal ends communicating with each other to flow a cooling water. In some examples, longitudinal ends of the first cooling jacket, the second cooling jacket, and the third cooling jacket can be vertically assembled in a slidable manner to block communicating portions thereof.

In some implementations, the cooling apparatus can further include a first main body including a seating surface configured to seat at least two vertically stacked cooling jackets, and a second main body that is located opposite to the first main body, that surrounds the at least two vertically stacked cooling jackets, and that is coupled to the first main body to compress the cooling jacket between the first main body and the second main body. In some examples, the first main body can be made of metal and is cast-molded, and the second main body can be injection-molded and can include a metal reinforcing bar.

In some examples, a plurality of reinforcing bars cannot overlap with the plurality of double-sided chip modules, can be disposed in a width direction of the second main body, and can have an elongated arrangement, and longitudinal ends of each of the plurality of reinforcing bars can protrude toward the first body.

In some implementations, the main flow path cannot have a constant height at both ends of a flow cross section.

In some examples, the at least two cooling jackets can include cooling ports that are connected to the longitudinal ends to introduce and discharge the cooling water.

DETAILED DESCRIPTION

Figure 1:
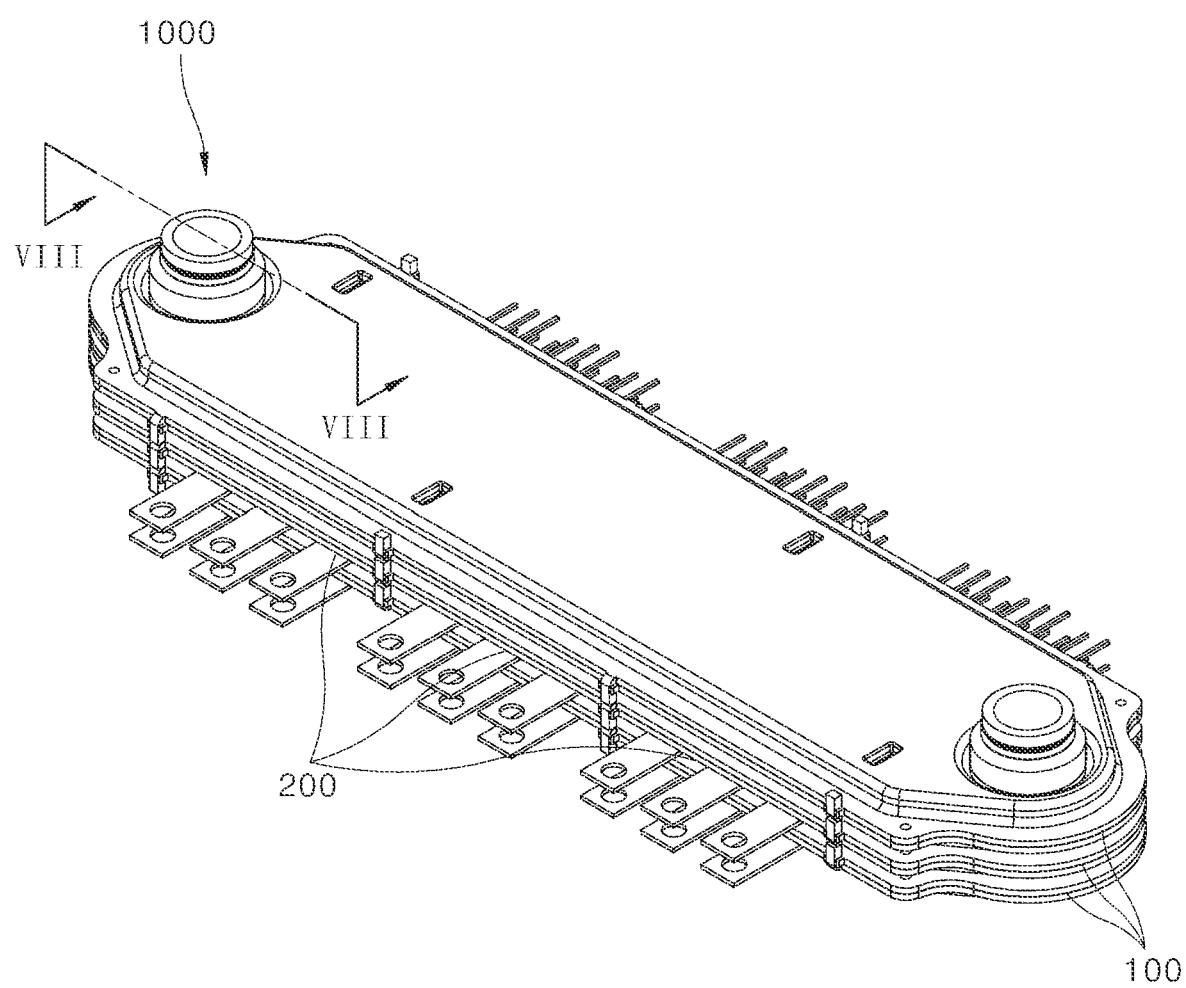
FIG. 1 is a diagram illustrating a perspective view of an exemplary cooling apparatus.
Figure 2:
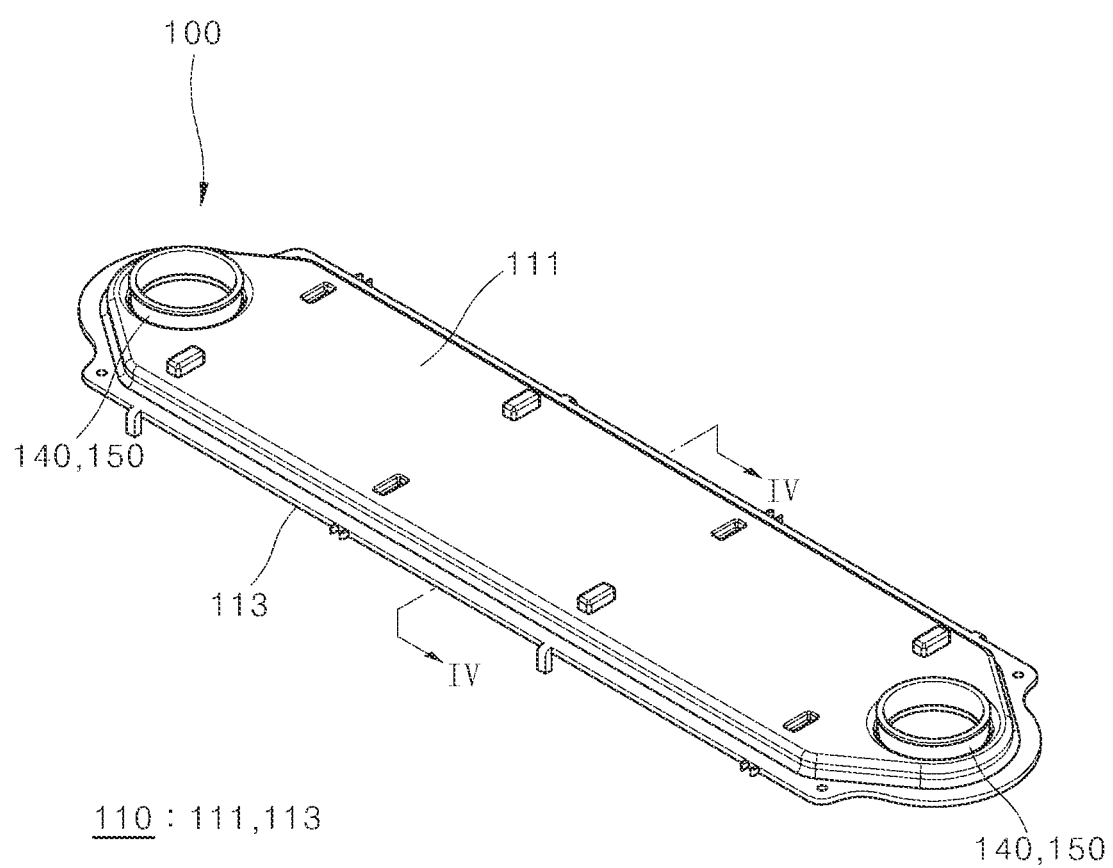
FIG. 2 is a diagram illustrating a perspective view of an exemplary cooling jacket.
Figure 3:
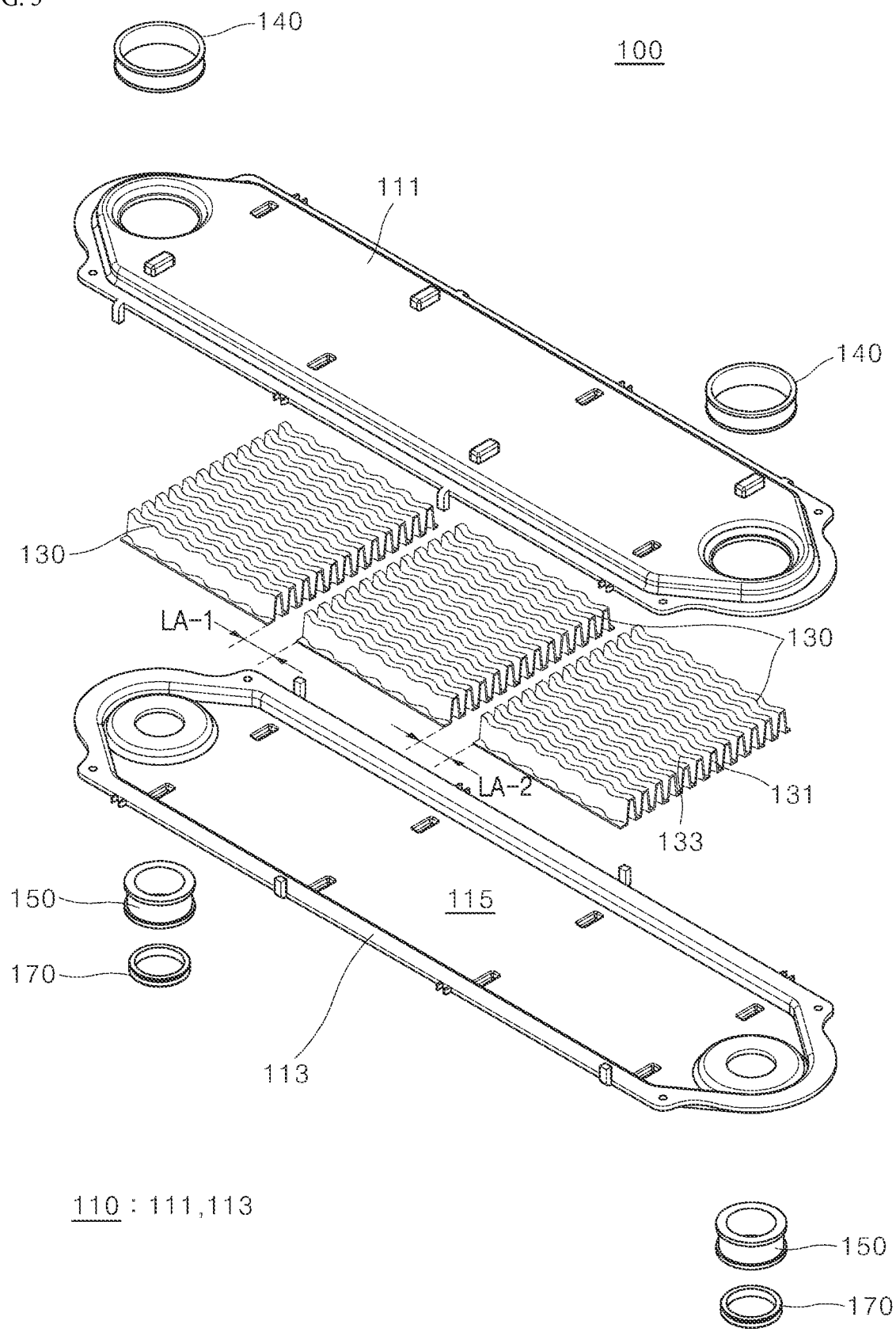
FIG. 3 is a diagram illustrating an exploded perspective view of the exemplary cooling jacket.

FIG. 1 is a diagram illustrating a perspective view of an exemplary cooling apparatus. FIGS. 2 and 3 are a perspective view and an exploded perspective view of an exemplary cooling jacket.

Referring to FIG. 1, a cooling apparatus 1000 can include a cooling jacket 100 and a plurality of double-sided chip modules 200.

As shown in FIGS. 2 and 3, the cooling jacket 100 can include a main body 110 and a cooling fin 130.

The main body 110 includes an upper plate 111 and a lower plate 113.

The upper plate 111 can be disposed at an upper portion of the main body 110. For example, the upper plate 111 is convex upward and a rim of the upper plate 111 is not convex upward.

The lower plate 113 can disposed at a lower portion of the main body 110. For example, the lower plate 113 is convex downward and a rim of the lower plate 113 is not convex downward.

The lower plate 113 can be symmetrical to the upper plate 111 and can be convex downward, and can have the rim joined to the rim of the upper plate 111.

An inner space having a predetermined size can be defined between the upper plate 111 and the lower plate 113. The inner space can be a cooling water flow path 115. In some implementations, a plurality of cooling fins 130 are disposed inside the main body 110.

The plurality of cooling fins 130 can be disposed inside the main body 110 along the cooling water flow path 115 and can be spaced apart from each other by a set distance. As shown in FIG. 3, three cooling fins 130 can be disposed inside the main body 110 and be spaced apart from each other, but the number the cooling fins 130 is not limited thereto.

The plurality of cooling fins 130 can be joined between the upper plate 111 and the lower plate 113 of the main body 110 and each have fixed positions.

Each of the plurality of double-sided chip modules 200 can be disposed between at least two cooling jackets 100 and has an upper surface and a lower surface contacting the cooling jackets 100.

Figure 7:
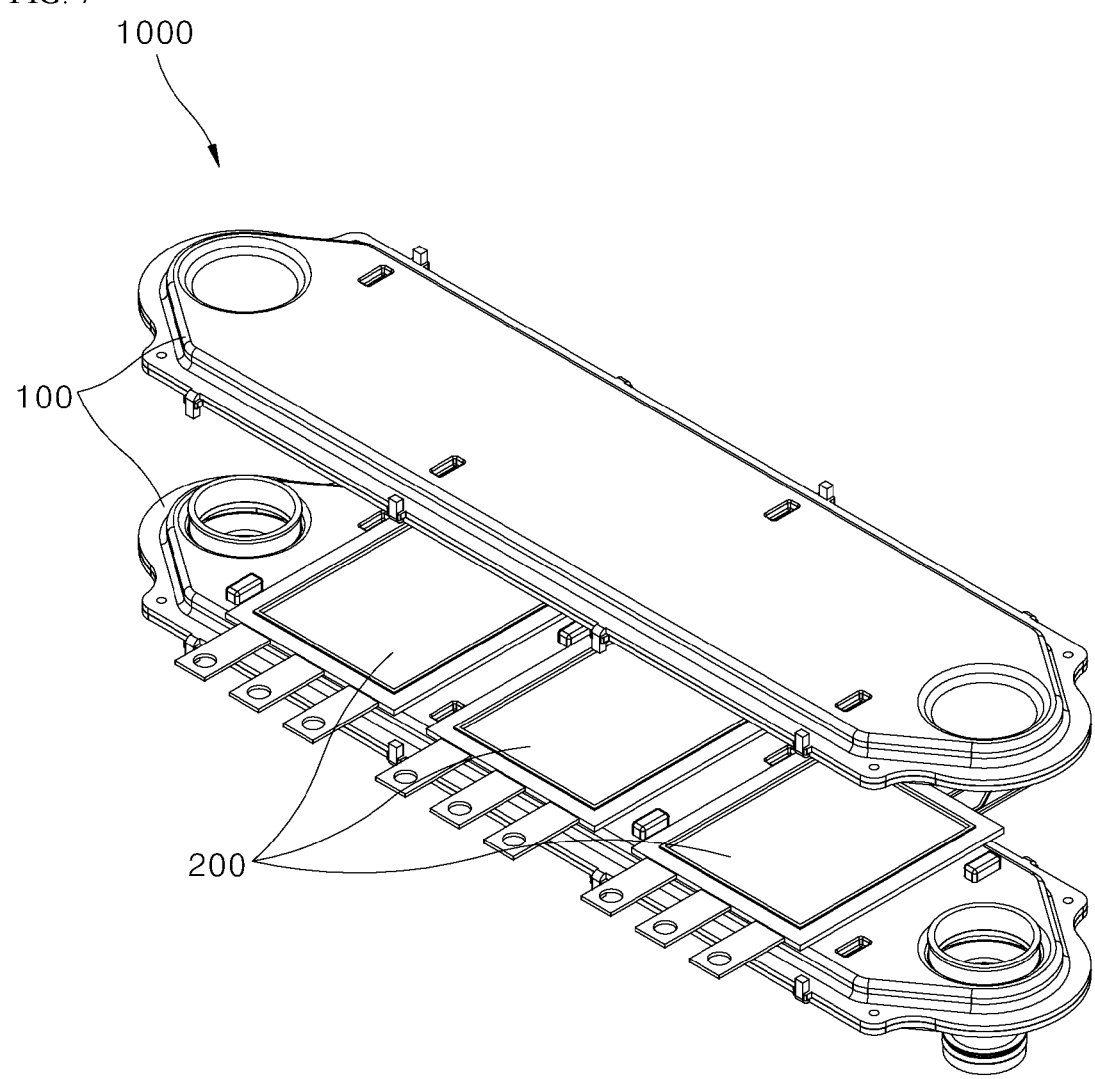
FIG. 7 is a diagram illustrating an exploded perspective view of an exemplary single-type cooling apparatus as another example of a cooling apparatus.

Referring to FIG. 1, three double-sided chip modules 200 can be disposed on each of two layers in two spaces formed between three cooling jackets 100 that are vertically stacked. Such cooling apparatus is referred to as "a double-type cooling apparatus". In some implementations, a cooling apparatus 1000 can include, as shown in FIG. 7, three double-sided chip modules 200 that are disposed on a single layer in a space formed between two cooling jackets 100 that are vertically stacked. Such cooling apparatus is referred to as "a single-type cooling apparatus".

The cooling jackets 100 can be disposed at upper surfaces and lower surfaces of the plurality of double-sided chip module 200, and can be vertically stacked.

For example, longitudinal ends of at least two cooling jackets 100 are vertically assembled in a slidable manner.

For example, the longitudinal ends of the at least two cooling jackets 100 vertically stacked can communicate with each other to enable flow of cooling water. In some implementations, cooling port 150 is connected to the longitudinal ends of each of the cooling jackets 100 to introduce and discharge the cooling water. For example, the upper surfaces and the lower surfaces thereof can be cooled simultaneously by the plurality of cooling fins 130 that are cooled by the cooling water flowing through the cooling jacket 100. To this end, the plurality of double-sided chip modules 200 can be provided at positions corresponding to the positions of the plurality of cooling fins 130, can face the plurality of cooling fins 130, and can be spaced apart from each other.

FIG. 2 is a diagram illustrating a perspective view of an exemplary cooling jacket. FIG. 3 is a diagram illustrating an exploded perspective view of the exemplary cooling jacket.

Referring to FIGS. 2 and 3, a main body 110 can include an upper plate 111 defining an upper portion of the main body 110 and a lower plate 113 defining a lower portion of the main body 110. A cooling water flow path 115 can be defined in an inner space formed between the upper plate 111 and the lower plate 113.

A plurality of cooling fins 130 can be disposed inside the main body 110 along the cooling water flow path 115 and can spaced apart from each other by a predetermined distance. For example, three cooling fins 130 are disposed inside a main body 110 and are spaced apart from each other by the predetermined distance, that is, have two separation distances (LA-1 and LA-2).

The plurality of cooling fins 130 can be joined (e.g., braze-joined) between the upper plate 111 and the lower plate 113.

The cooling ports 150 can be disposed at the longitudinal ends of the cooling jacket 100 to introduce and discharge the cooling water and communicate with a cooling water flow path 115.

In some implementations, the cooling jacket 100 further includes a port guide 140 and a seal ring 170 each provided at a position corresponding to that of the cooling port 150.

The port guide 140 can face the plurality of cooling jackets 100, can be slidably assembled with the plurality of cooling jackets 100, and can be stacked vertically. In some implementations, the seal ring 170 maintains airtightness between the cooling port 150 and the outside.

Figure 4:
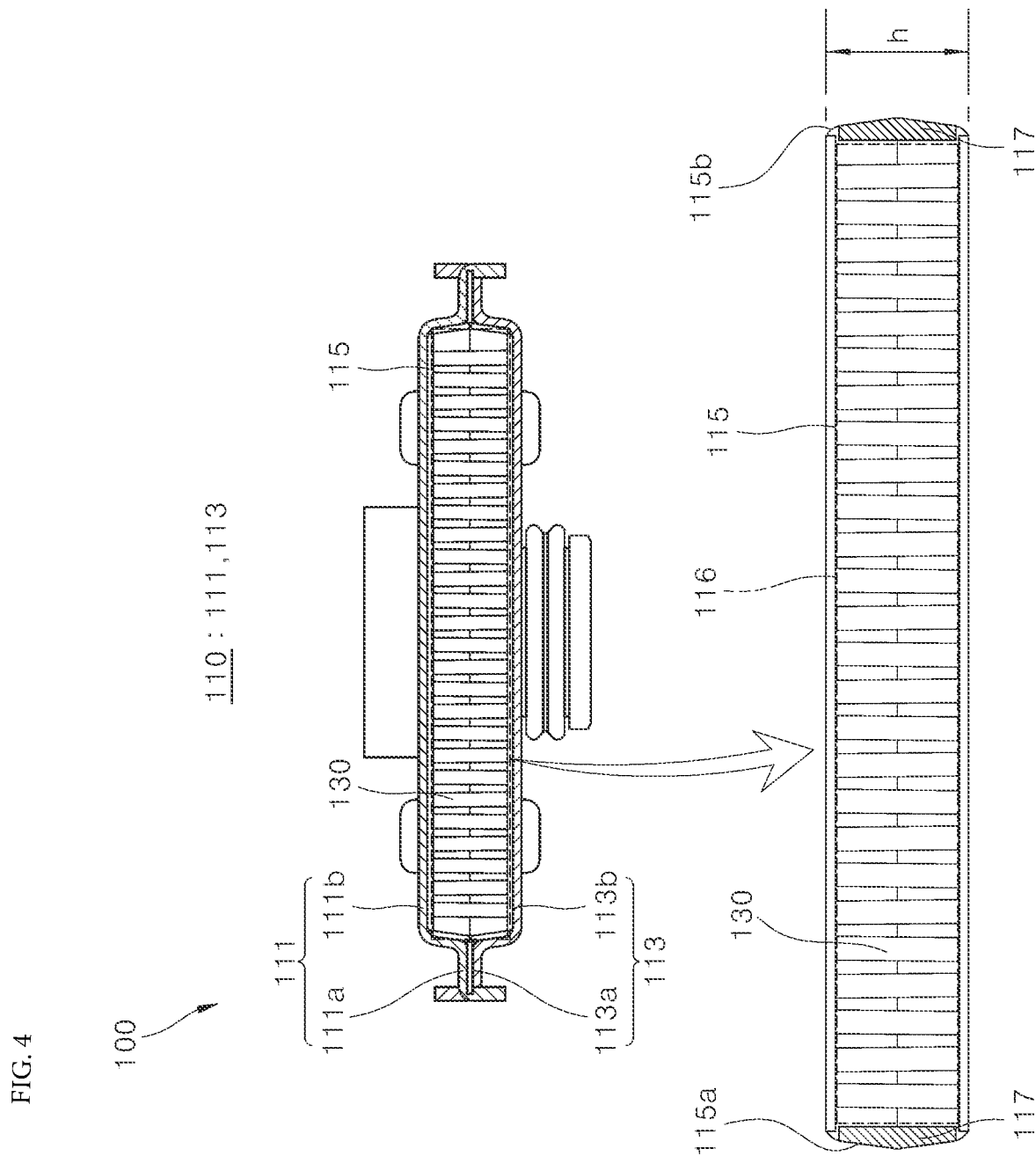
FIG. 4 is a diagram illustrating an enlarged cross-sectional view of the exemplary cooling jacket taken along line "III-III" in FIG. 2.

FIG. 4 is a diagram illustrating a cross-sectional view of the exemplary cooling jacket 100 taken along line "IV-IV" in FIG. 2 in detail.

The cooling jacket 100 can include a main body 110 defining a cooling water flow path 115 and cooling fins 130 disposed inside the main body 110.

The main body 110 can include an upper plate 111 and a lower plate 113.

The upper plate 111 can include a first flat portion 111a and a first convex portion 111b.

The first flat portion 111a can refer to an edge, that is, a flat portion defined along the edges of both sides joined to the lower plate 113. The first convex portion 111b can refer to a portion that is convex upward to form the cooling water flow path 115.

The lower plate 113 can include a second flat portion 113a and a second convex portion 113b.

The second flat portion 113a can refer to a portion facing the first flat portion 111a and having a flat shape to be joined to the first flat portion 111a. The second convex portion 113b can be symmetrical with the first convex portion 111b in a vertical direction thereof. For example, the second convex portion 113b has a size and a shape corresponding to those of the first convex portion 111b. In some implementations, the first convex portion 111b has an upward convex portion and the second convex portion 113b has a downward convex portion.

As described above, the upper plate 111 and the lower plate 113 can form an integrated main body 110 by braze-joining between the first flat portion 111a and the second flat portion 113a. In some implementations, when the first flat portion 111a and the second flat portion 113a are joined, the cooling water flow path 115 is defined in the space between the first convex portion 111b and the second convex portion 113b.

The cooling water flow path 115 can provide a main flow path 116. In some implementations, the cooling water flow path 115 can provide main flow path 116 except for both ends 115a and 115b of a flow cross-section (S). The main flow path 116 can refer to an area into which the cooling fins 130 are inserted. For example, the cooling water cools the cooling fins 130 through the main flow path 116, and the cooled cooling fins 130 cool the double-sided chip modules 200 (see FIG. 1).

For example, the main flow path 116 can be an inner area of the cooling water flow path 115, and as shown in FIG. 4, the main flow path 116 can have a rectangular cross-sectional shape with a predetermined height (h). In some implementations, the main flow path 116 can be an inner area of the cooling water flow path 115 except for the both ends 115a and 115b. By way of further example, the cooling fins 130 manufactured with the constant vertical height can be inserted into and disposed at the main flow path 116.

In some implementations, a flow inhibitor 117 can be further disposed in at least one of the both ends 115a or 115b of the cooling water flow path 115 to inhibit flow of cooling water.

For example, the flow inhibitors 117 can be disposed at the both ends 115a and 115b of the flow path. In some implementations, the flow inhibitors 117 can be disposed at the both ends 115a and 115b of the flow path except for the main flow path 116 where the cooling fins 130 are not disposed.

For example, the flow inhibitors 117 can block the cooling water from flowing through the both ends 115a and 115b of the cooling water flow path 115, where the cooling fins 130 are not disposed, thereby improving a cooling efficiency.

As a specific example, the flow inhibitor 117 can be disposed within separation distances (e.g., LA-1 and LA-2 of FIG. 3) of the cooling fins 130, thereby improving the cooling effect without interference between the flow inhibitor 117 and the cooling fin 130.

In some implementations, the flow inhibitor 117 can have various shapes. For example, various shapes can be used without limitation if the flow inhibitor 117 can block or hinder the flow of the cooling water at the position of the flow inhibitor 117.

Referring to FIG. 3, the cooling fin 130 has a wave shape.

For example, the wave shape of the cooling fin 130 includes a first corrugated shape 131 and a second corrugated shape 133. The first corrugated shape 131 can refer to a shape corrugated in a cross-sectional direction of the cooling water flow path 115. The second corrugated shape 133 can refer to a shape corrugated in a longitudinal direction of the cooling water flow path 115.

In some implementations, the wave shape of the cooling fin 130 can be compression-deformed within a predetermined range when an external force is applied in a height direction of the main body 110, that is, in a direction of vertically pressing the upper plate 111 and the lower plate 113. Therefore, when the cooling apparatus is assembled by disposing the double-sided chip modules 200 between the cooling jackets 100, damage to the double-sided chip modules can be limited.

Figure 5:
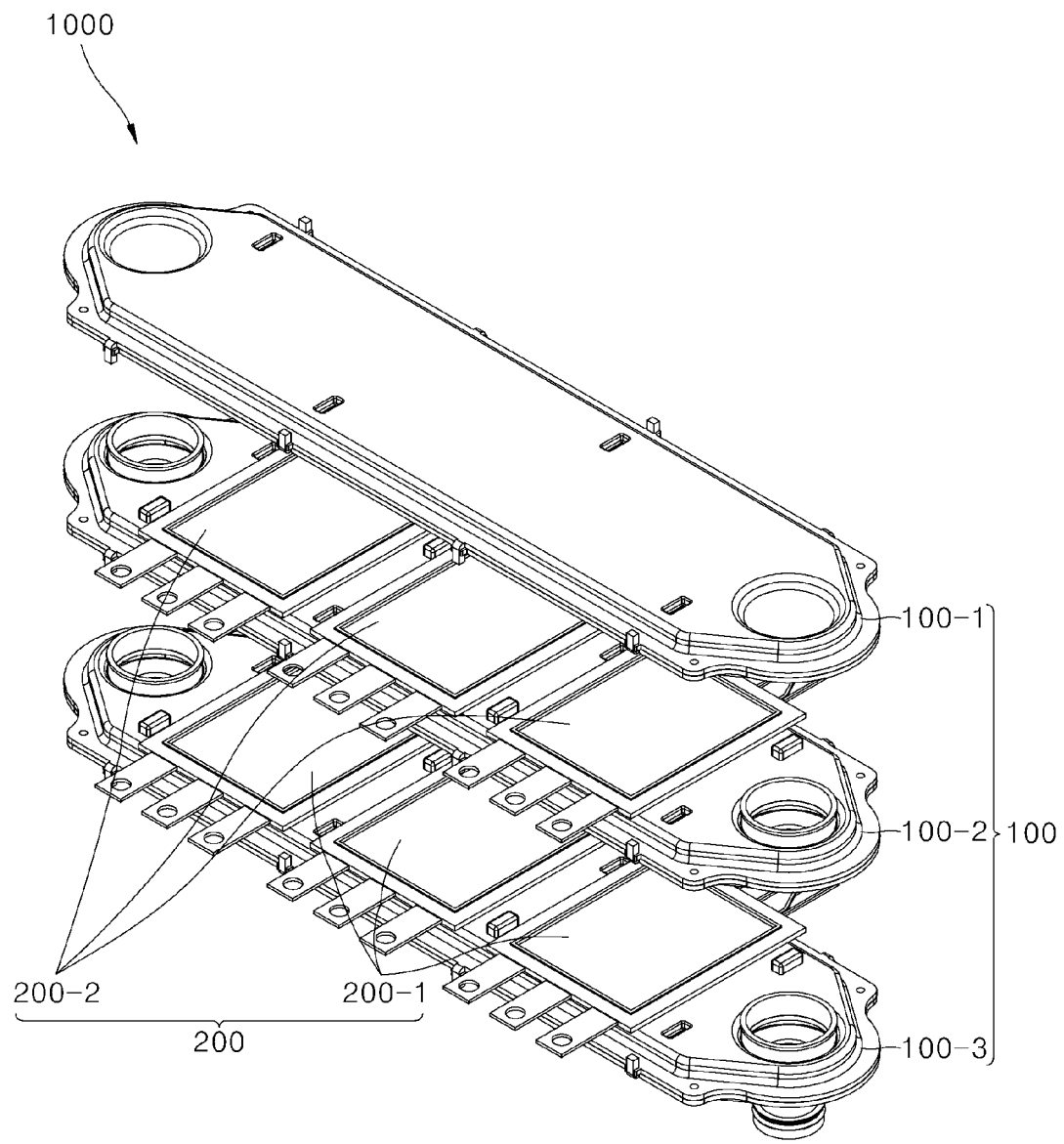
FIG. 5 is a diagram illustrating an exploded perspective view of an exemplary double-type cooling apparatus as an example of a cooling apparatus.
Figure 6:
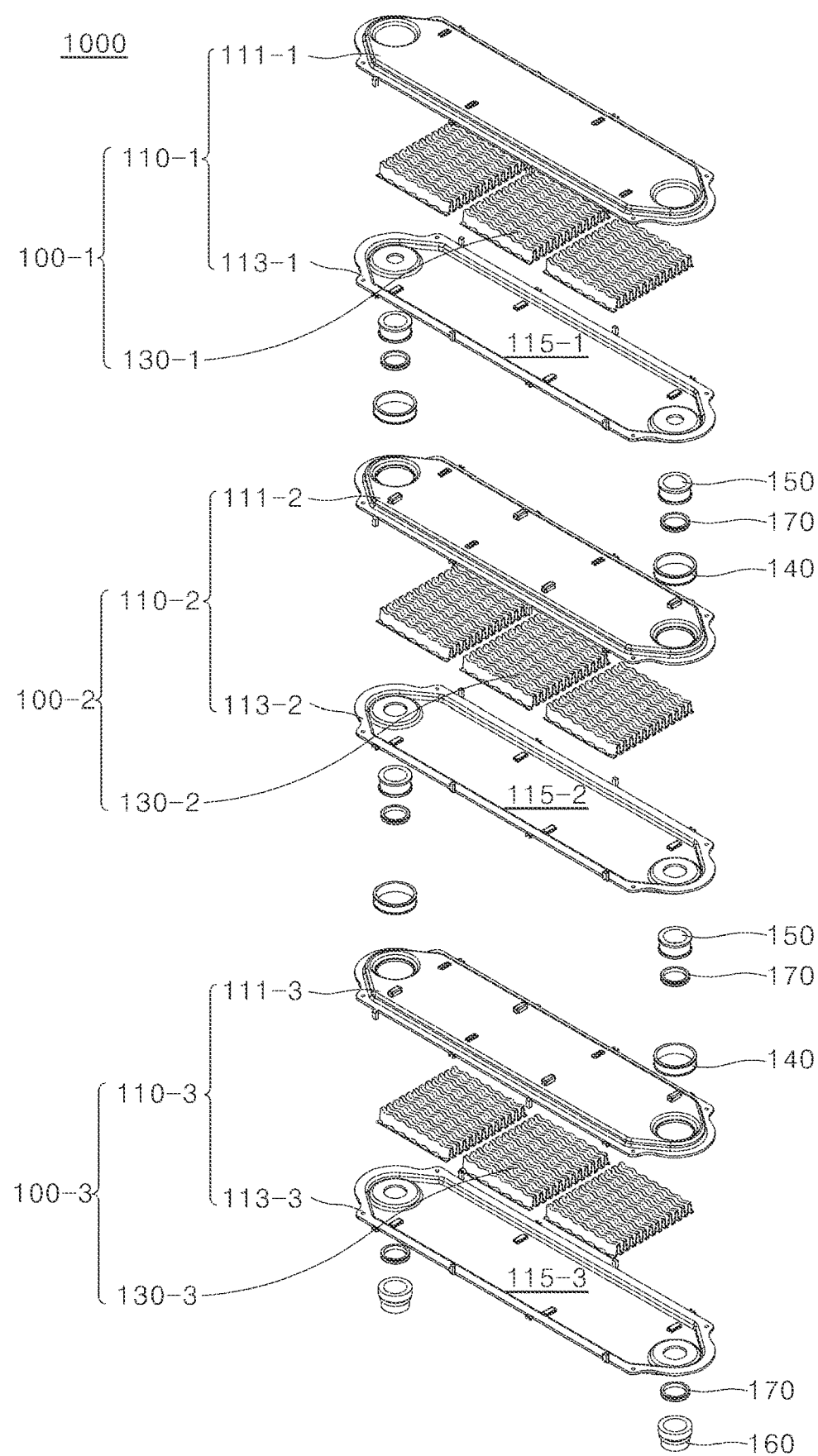
FIG. 6 is a diagram illustrating an exploded perspective view of a plurality of cooling jackets of an exemplary cooling apparatus that are stacked and coupled.

FIG. 5 is a diagram illustrating an exploded perspective view of an exemplary double-type cooling apparatus as an example of a cooling apparatus. FIG. 6 is a diagram illustrating an exploded perspective view of a stacked coupling among cooling jackets of a cooling apparatus.

Referring to FIG. 5, at least two cooling jackets 100 face an upper surface and a lower surface of each of a plurality of double-sided chip modules 200. The cooling jackets 100 have longitudinal ends that are vertically assembled in a slidable manner to block communicating portions thereof.

In some implementations, a plurality of double-sided chip modules 200 have a number corresponding to that of the plurality of cooling fins 130 (see FIG. 3). Further, each of the plurality of double-sided chip modules 200 is provided at a position facing each of the plurality of cooling fins 130 (see FIG. 3). For example, the double-sided chip modules 200 face the cooling fins 130 (see FIG. 3) to improve a cooling efficiency.

For example, as shown in FIG. 3, three cooling fins 130 (see FIG. 3) can be disposed inside a main body 110, can be spaced apart from each other by predetermined separation distances LA-1 and LA-2, and can be arranged in a row. By way of further example, the double-sided chip modules 200 can have a number corresponding to that of cooling fins 130 (see FIG. 3), that is, can include three double-sided chip modules 200. The three double-side chip modules 200 can be disposed on a layer and can be spaced apart from each other by predetermined separation distances.

In some implementations, the separation distance between the double-sided chip modules 200 can correspond to the separation distance between the cooling fins 130 (see FIG. 3).

In some implementations, each cooling fin 130 (see FIG. 3) can have a planar shape corresponding to that of one of the double-sided chip modules 200 and can have a planar area with a size corresponding to that of one of the double-sided chip modules 200.

For example, the cooling fins 130 (see FIG. 3) can have the same planar shape and size as the double-sided chip modules 200 and can vertically face the double-sided chip modules 200, thereby effectively cooling the double-sided chip modules 200.

Referring to FIGS. 5 and 6, an exemplary double-type cooling apparatus 1000 as an example of a cooling is described.

The illustrated double-type cooling apparatus 1000 includes three cooling jackets (hereinafter, a first cooling jacket 100-1, a second cooling jacket 100-2, and a third cooling jacket 100-3).

The first cooling jacket 100-1 can include a first main body 110-1 and three first cooling fins 130-1. The first main body 110-1 can include a first upper plate 111-1 and a first lower plate 113-1. A first cooling water flow path 115-1 can be defined between the first upper plate 111-1 and the first lower plate 113-1 of the first main body 110-1.

The second cooling jacket 100-2 can include a second main body 110-2 and three second cooling fins 130-2. The second main body 110-2 can include a second upper plate 111-2 and a second lower plate 113-2. A second cooling water flow path 115-2 can be defined between the second upper plate 111-2 and the second lower plate 113-2 of the second main body 110-2.

The third cooling jacket 100-3 can include a third main body 110-3 and three third cooling fins 130-3. The third main body 110-3 can include a third upper plate 111-3 and a third lower plate 113-3. A third cooling water flow path 115-3 can be defined between the third upper plate 111-3 and the third lower plate 113-3 of the third main body 110-3.

The first cooling jacket 100-1, the second cooling jacket 100-2, and the third cooling jacket 100-3 can be stacked vertically and can define the cooling water flow paths communicating with each other.

Cooling ports 150 and 160 can be disposed at longitudinal ends of each of the first cooling jacket 100-1, the second cooling jacket 100-2, and the third cooling jacket 100-3 to introduce and discharge cooling water. In some implementations, a port guide 140 is provided at a position corresponding to the position of each of the cooling ports 150 and 160. In some implementations, a seal ring 170 is further disposed to maintain airtightness with the outside.

The double-type cooling apparatus 1000 illustrated in FIGS. 5 and 6 can include a plurality of double-sided chip modules 200 that are provided on different layers.

For example, the double-sided chip module 200 includes three first double-sided chip modules 200-1 and three second double-sided chip modules 200-2.

The first double-sided chip module 200-1 can disposed between the first cooling jacket 100-1 and the second cooling jacket 100-2 and can have an upper surface and a lower surface contacting the first cooling jacket 100-1 and the second cooling jacket 100-2. The first double-sided chip module 200-1 can have a number corresponding to that of each of a first cooling fin 130-1 and a second cooling fin 130-2, that is, can include three first double-sided chip modules 200-1. Positions of the three first double-sided chip modules 200-1 can correspond to those of each of the first cooling fin 130-1 and the second cooling fin 130-2 and the three first double-sided chip modules 200-1 can face each of the first cooling fin 130-1 and the second cooling fin 130-2.

The second double-sided chip module 200-2 can disposed between the second cooling jacket 100-2 and the third cooling jacket 100-3 and can have an upper surface and a lower surface contacting the second cooling jacket 100-2 and the third cooling jacket 100-3. The second double-sided chip module 200-2 can have a number corresponding to that of each of a second cooling fin 130-2 and a third cooling fin 130-3, that is, can include three second double-sided chip modules 200-2. Positions of the three second double-sided chip modules 200-2 can correspond to those of each of the second cooling fin 130-2 and the third cooling fin 130-3 and the three second double-sided chip modules 200-2 can face each of the second cooling fin 130-2 and the third cooling fin 130-3.

FIG. 7 is a diagram illustrating an exploded perspective view of an exemplary single-type cooling apparatus as another example of a cooling apparatus.

A cooling apparatus 1000 shown in FIG. 7 is a single-type cooling apparatus. The single-type cooling apparatus 1000 in FIG. 7 can be different from the double-type cooling apparatus shown in FIG. 5 in that the single-type cooling apparatus in FIG. 7 includes two cooling jackets 100 and three double-sided chip modules 200 disposed on a single layer between the two cooling jackets 100. The cooling jacket 100, the double-sided chip module 200, and coupling relation and positional relation thereof are already described, and redundant descriptions thereof are omitted.

A sliding assembly structure among cooling jackets of a cooling apparatus is described with reference to FIGS. 8 and 9.

Figure 8:
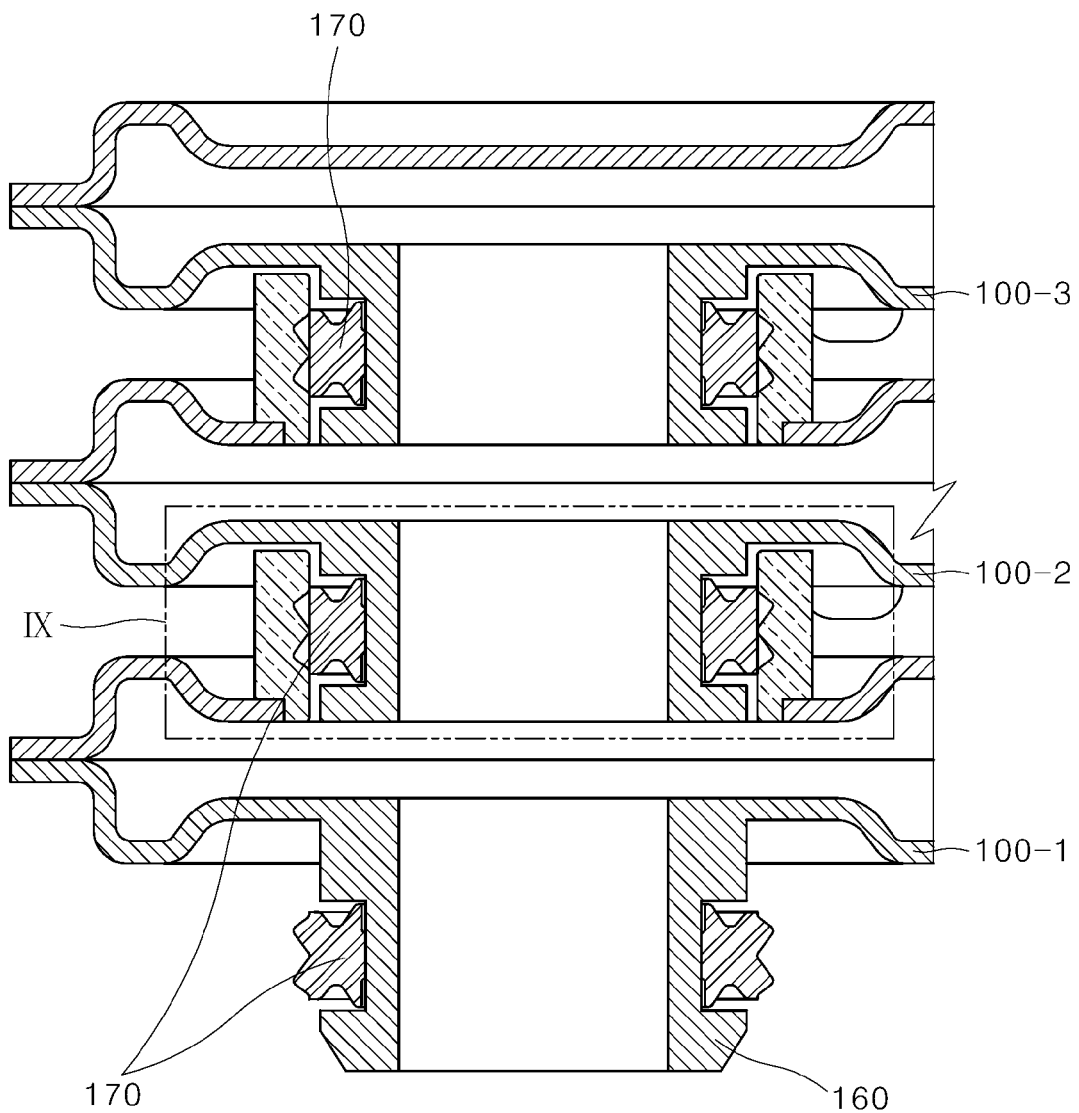
FIG. 8 is a diagram illustrating an enlarged cross-sectional view taken along line "VIII-VIII" in FIG. 1.

FIG. 8 is a diagram illustrating a cross-sectional view taken along line "VIII-VIII" in FIG. 1.

Referring to FIG. 8, for a double-type cooling apparatus, longitudinal ends of a first cooling jacket 100-1, a second cooling jacket 100-2, and a third cooling jacket 100-3 can communicate with each other and can be slidably coupled.

For example, the longitudinal ends of the first cooling jacket 100-1, the second cooling jacket 100-2, and the third cooling jacket 100-3 communicate with each other and cooling water flow paths defined at the first cooling jacket 100-1, the second cooling jacket 100-2, and the third cooling jacket 100-3 are connected to each other. By way of further example, the cooling water introduced through the cooling port 160 disposed at the first cooling jacket 100-1 is supplied to the second cooling jacket 100-2 and the third cooling jacket 100-3 and can flow along the cooling water flow paths of the first cooling jacket 100-1, the second cooling jacket 100-2, and the third cooling jacket 100-3.

Figure 9:
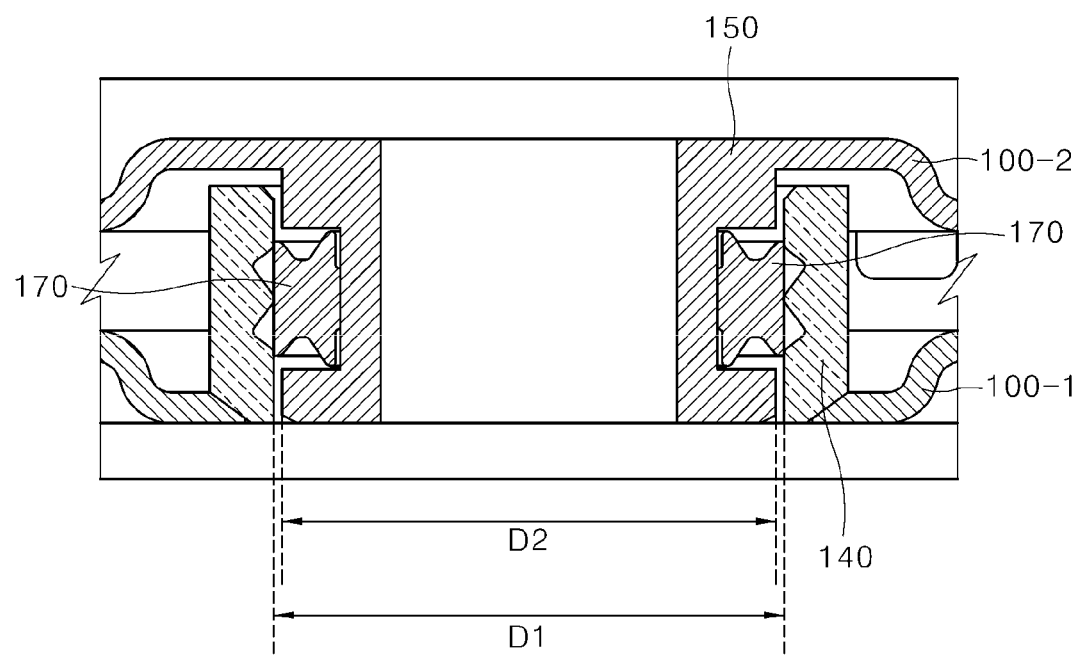
FIG. 9 is a diagram illustrating an enlarged cross-sectional view of area "IX" in FIG. 8.

FIG. 9 is a diagram illustrating an enlarged cross-sectional view of area "IX" in FIG. 8.

Referring to FIG. 9, a sliding assembly portion between a first cooling jacket 100-1 and a second cooling jacket 100-2 is shown.

A port guide 140 and a cooling port 150 can be assembled vertically in a slidable manner.

For example, as an inner diameter (D1) of the port guide 140 has a size corresponding to that of an outer diameter (D2) of the cooling port 150 such that the cooling port 150 can be easily slidably assembled to the port guide 140. Therefore, assembly tolerance can be omitted.

A seal ring 170 can be inserted into the sliding assembly portion between the port guide 140 and the cooling port 150. For example, the seal ring 170 maintains airtightness of the sliding assembly portion, and an X-ring and the like can be used.

For example, longitudinal ends of the first cooling jacket 100-1, the second cooling jacket 100-2, and the third cooling jacket 100-3 are assembled vertically in a slidable manner to completely block the communicating portions thereof.

Figure 10:
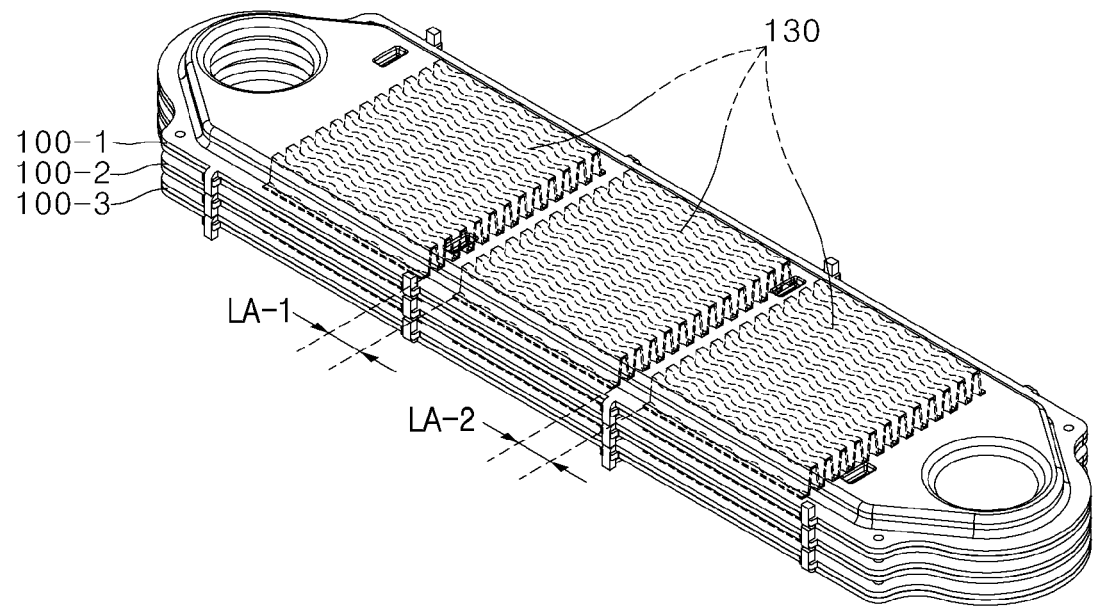
FIG. 10 is a configuration diagram of a three-dimensional shape of a cooling fin of a cooling jacket of an exemplary cooling apparatus.

FIG. 10 is a configuration diagram showing a three-dimensional shape of a cooling fins of a cooling jacket of an exemplary cooling apparatus.

Referring to FIG. 10, for a double-type cooling apparatus, three cooling jackets, a first cooling jacket 100-1, a second cooling jacket 100-2, and a third cooling jacket 100-3, can be vertically coupled to each other and can define two layers between the three cooling jackets, where each of the two layers is configured to place three double-sided chip modules 200 (see FIG. 5).

The first cooling jacket 100-1, the second cooling jacket 100-2, and the third cooling jacket 100-3 can define cooling water flow paths that communicate with each other. Three cooling fins 130 can be disposed at each of the cooling water flow paths and have a number, a size, a shape, and a position corresponding to those of the double-sided chip modules 200 (see FIG. 5). For example, the cooling fins 130 are disposed on each of the first cooling jacket 100-1, the second cooling jacket 100-2, and the third cooling jacket 100-3, and have the same shape.

In some implementations, the flow inhibitors 117 (see FIG. 4) can be further disposed at both sides of the cooling water flow path 115 to block flow of cooling water. For example, the flow inhibitors 117 (see FIG. 4) are disposed at the both ends of the cooling water flow path, to block the flow of the cooling water through the positions thereof. In some implementations, the flow inhibitor 117 (see FIG. 4) is disposed within each of separation distances (LA-1 and LA-2) of the cooling fins to block positional interference with the cooling fins 130.

Figure 11:
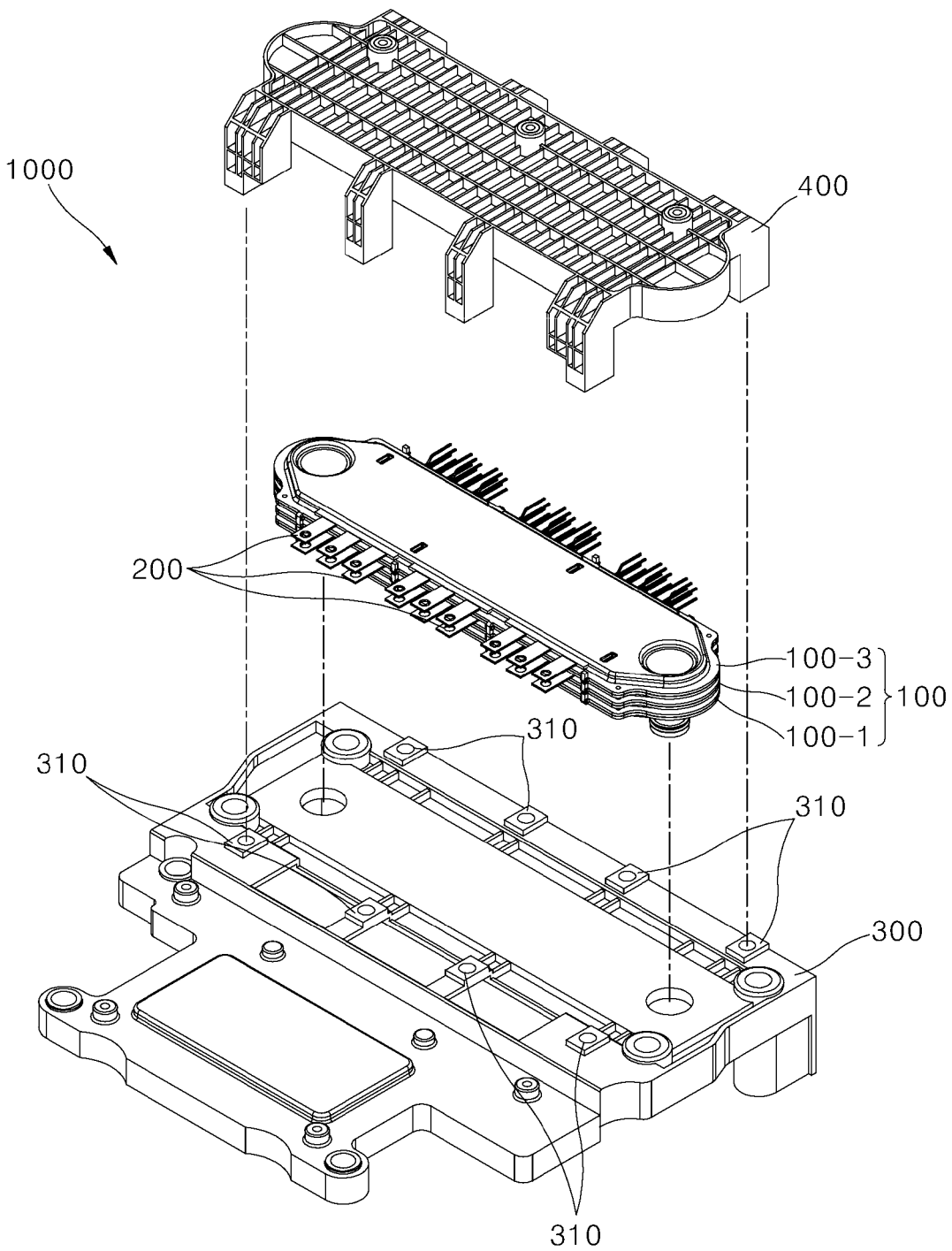
FIG. 11 is a diagram illustrating an exploded perspective view of a first main body and a second main body to be coupled to each other in an exemplary cooling apparatus.
Figure 12:
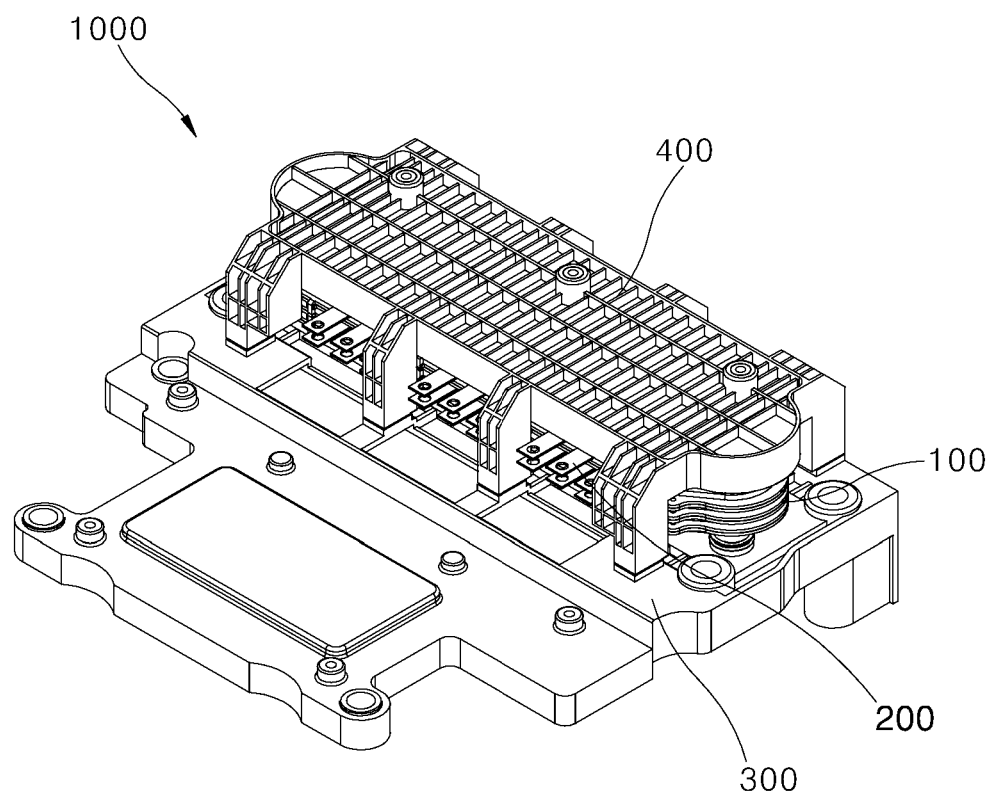
FIG. 12 is a diagram illustrating a perspective view of a first main body and a second main body coupled to each other in an exemplary cooling apparatus.

FIG. 11 is a diagram illustrating an exploded perspective view of a first main body and a second main body to be coupled in an exemplary cooling apparatus. FIG. 12 is a diagram illustrating a perspective view of a first main body and a second main body coupled to each other in an exemplary cooling apparatus.

Referring to FIGS. 11 and 12, a cooling apparatus 1000 can further include a first main body 300 and a second main body 400.

The first main body 300 can provide a seating surface configured to seat at least two cooling jackets 100 that are vertically stacked. For example, in the case of a double-type cooling apparatus, three cooling jackets 100 are stacked vertically and the first main body 300 seats and fixes a first cooling jacket 100-1.

The second main body 400 can be disposed at an opposite side of the first main body 300, can surround at least two cooling jackets 100 that are vertically stacked, and can be coupled to the first main body 300. For example, when the second main body 400 is mechanically coupled (e.g., screw-coupled) to the first main body 300, the first main body 300 and the second main body 400 vertically compress the cooling jacket 100 disposed between the first main body 300 and the second main body 400.

When the first main body 300 and the second main body 400 are coupled to each other, the cooling jacket 100 can receive a compressive force vertically (e.g., in a height direction). For example, as a wave shape of each of cooling fins 130 disposed inside the cooling jacket 100 can be compression-deformed within a predetermined range, a damage to the double-sided chip modules 200 disposed between the cooling jackets 100 can be limited.

The first main body 300 can be made of metal. For example, the first main body 300 can be manufactured by cast-molding as shown.

The second main body 400 can be injection-molded into the complex shape such as the illustrated shape. For example, reinforcing bars 500, as depicted in FIG. 13, are further disposed inside the second main body 400 to apply a predetermined compressive force by mechanically coupling the first main body 300 and the second main body 400.

The reinforcing bar 500 can refer to a metal member inserted into the injection-molded second main body 400.

Figure 13:
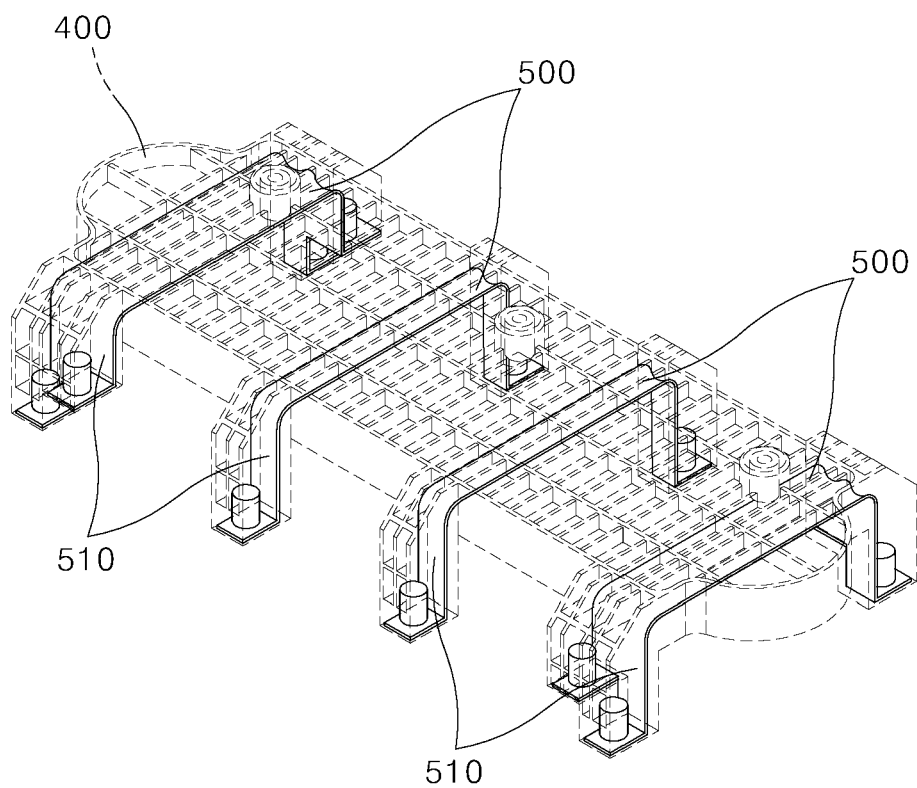
FIG. 13 is a configuration diagram showing an arrangement of reinforcing bars disposed at a second main body.

For example, as shown in FIG. 13, a plurality of reinforcing bars 500 (e.g., four reinforcing bars) may not be provided at positions corresponding to the positions of the double-sided chip modules 200 of the cooling apparatus 1000, but can be disposed in a width direction of the second main body 400 and have an elongated arrangement.

For example, when the first main body 300 and the second main body 400 are screw-coupled, bolts are coupled between longitudinal ends 510 of the reinforcing bar 500 and the first main body 300.

By way of further example, a compressive force is applied between the reinforcing bars 500 and the first main body 300.

That is, the reinforcing bar 500 can be provided at positions rather than the positions of the double-sided chip module 200 to limit damage to the double-sided chip modules 200.

In some implementations, the longitudinal ends 510 of the reinforcing bar 500 can protrude toward the first main body 300 and can have an elongated shape. The longitudinal ends 510 of the reinforcing bar 500 can contact and can be connected to bolt fasteners 310 (see FIG. 11) disposed on the first main body 300 to mechanically couple the first main body 300 and the second main body 400 using a plurality of bolts.

As described above, according to the implementations and operations of the present disclosure, the cooling apparatus has the structure suitable for cooling the double-sided chip modules in the miniaturized inverter to improve cooling performance.

Furthermore, the wave shape of the cooling fin can be vertically compression-deformed to improve a cooling effect, and when the external force is applied vertically, damages to the double-sided chip modules can be limited.

Moreover, the plurality of vertically stacked cooling jackets can be rigidly coupled to each other between the first main body made of metal and casting-molded and the first main body that is injection-molded by mechanically coupling the first main body and the second main body.

Furthermore, the reinforcing bars are further provided at the positions not corresponding to the positions of the double-sided chip modules to maintain the rigid coupling and prevent damage to the double-sided chip modules.

The invention claimed is:

1. A cooling apparatus, comprising:
   a main body including an upper plate and a lower plate that are joined to each other, the main body being configured to provide a cooling water flow path in an inner space between the upper plate and the lower plate;
   a plurality of cooling jackets each including a plurality of cooling fins, the plurality of cooling fins being (i) disposed inside the main body along the cooling water flow path, (ii) spaced apart from each other by a set distance, and (iii) joined between the upper plate and the lower plate;
   a plurality of double-sided chip modules disposed between at least two of the plurality of cooling jackets and having an upper surface and a lower surface contacting the at least two cooling jackets;
   a first main body including a seating surface configured to receive at least two vertically stacked cooling jackets; and
   a second main body that is located opposite to the first main body, that surrounds the at least two vertically stacked cooling jackets, and that is coupled to the first main body,
   wherein each module of the plurality of double-sided chip modules is (i) located at a position corresponding to a position of one of the plurality of cooling fins, (ii) facing the one of the plurality of cooling fins, and (iii) spaced apart from at least one other module among the plurality of double-sided chip modules to simultaneously cool the upper surface and the lower surface,
   wherein the second main body includes a plurality of reinforcing bars that do not overlap with each of the plurality of double-sided chip modules and that is disposed in a width direction of the second main body, and
   wherein each of the plurality of cooling jackets is compressed in a vertical direction between the reinforcing bars and the first main body.

2. The cooling apparatus of claim 1,
   wherein the upper plate comprises a first flat portion defined along an edge thereof and a first convex portion that is convex upward around the first flat portion,
   wherein the lower plate comprises a second flat portion that is defined along an edge of the lower plate and that faces and contacts the first flat portion, and a second convex portion that is symmetrical with the first convex portion and that is convex downward,
   wherein the first flat portion and the second flat portion are braze-joined and the cooling water flow path is provided between the first convex portion and the second convex portion.

3. The cooling apparatus of claim 1, wherein the cooling water flow path includes a main flow path having a constant height and a rectangular cross-sectional shape, and
   wherein the cooling fin is inserted into the main flow path.

4. The cooling apparatus of claim 3, wherein the main flow path does not have a constant height at both ends of a flow cross section.

5. The cooling apparatus of claim 3, further comprising a flow inhibitor that is disposed on at least one end of a flow cross-section of the cooling water flow path to block a cooling water flow,
   wherein the flow inhibitor is disposed within each of separation distances of the plurality of cooling fins.

6. The cooling apparatus of claim 1, wherein the at least two cooling jackets vertically facing the plurality of double-sided chip modules have longitudinal ends communicating with each other to flow a cooling water.

7. The cooling apparatus of claim 6, wherein the at least two cooling jackets vertically facing the plurality of double-sided chip modules are vertically assembled in a slidable manner at the longitudinal ends to block communicating portions thereof.

8. The cooling apparatus of claim 6, wherein the at least two cooling jackets include cooling ports that are connected to the longitudinal ends to introduce and discharge the cooling water.

9. The cooling apparatus of claim 1, wherein a number of the plurality of cooling fins corresponds to a number of the plurality of double-sided chip modules, and each of the plurality of cooling fins faces one of the plurality of double-sided chip modules.

10. The cooling apparatus of claim 9, wherein each of the plurality of cooling fins has a shape corresponding to a planar shape of one of the double-sided chip modules and has an area with a size corresponding to a plane size of the one of the double-sided chip modules.

11. The cooling apparatus of claim 1, wherein the cooling fin has a wave shape.

12. The cooling apparatus of claim 11, wherein the wave shape of the cooling fin includes a first corrugated shape in a cross-sectional direction of the cooling water flow path and a second corrugated shape in a longitudinal direction of the cooling water flow path.

13. The cooling apparatus of claim 11, wherein the wave shape of the cooling fin is compression-deformed within a predetermined range based on an external force being applied to the upper plate and the lower plate in a height direction.

14. The cooling apparatus of claim 1, wherein the plurality of cooling jackets comprise:
a first cooling jacket including a first main body and a plurality of first cooling fins, the first main body of the first cooling jacket including a first upper plate and a first lower plate joined to each other and configured to provide a first cooling water flow path between the first upper plate and the first lower plate, and the plurality of first cooling fins disposed along the first cooling water flow path, spaced apart from each other, and joined between the first upper plate and the first lower plate;
a second cooling jacket stacked on the first cooling jacket and including a second main body and a plurality of second cooling fins, the second main body including a second upper plate and a second lower plate joined to each other and configured to provide a second cooling water flow path between the second upper plate and the second lower plate, and the plurality of second cooling fins disposed along the second cooling water flow path, spaced apart from each other, and joined between the second upper plate and the second lower plate; and
a third cooling jacket stacked on the second cooling jacket and including a third main body and a plurality of third cooling fins, the third main body including a third upper plate and a third lower plate joined to each other and configured to provide a third cooling water flow path between the third upper plate and the third lower plate, and the plurality of third cooling fins disposed along the third cooling water flow path, spaced apart from each other, and joined between the third upper plate and the third lower plate.

15. The cooling apparatus of claim 14, wherein the plurality of double-sided chip modules include:
a plurality of first double-sided chip modules disposed between the first cooling jacket and the second cooling jacket and having an upper surface and a lower surface contacting the first cooling jacket and the second cooling jacket, each module of the plurality of first double-sided chip modules provided at a position corresponding to a position of each of the plurality of first cooling fins and the plurality of second cooling fins and facing the corresponding first cooling fin and the corresponding second cooling fin; and
a plurality of second double-sided chip modules disposed between the second cooling jacket and the third cooling jacket and having an upper surface and a lower surface contacting the second cooling jacket and the third cooling jacket, each module of the plurality of second double-sided chip modules provided at a position corresponding to a position of each of the plurality of second cooling fins and the plurality of third cooling fins and facing the corresponding second cooling fin and the corresponding third cooling fin.

16. The cooling apparatus of claim 15, wherein longitudinal ends of the first cooling jacket, the second cooling jacket, and the third cooling jacket are vertically assembled in a slidable manner to block communicating portions thereof.

17. The cooling apparatus of claim 14, wherein the first cooling jacket, the second cooling jacket, and the third cooling jacket have longitudinal ends communicating with each other to flow a cooling water.

18. The cooling apparatus of claim 1,
wherein the first main body is made of metal and is cast-molded, and
wherein the second main body is injection-molded.

19. The cooling apparatus of claim 18,
wherein longitudinal ends of each of the plurality of reinforcing bars protrude toward the first main body.

* * * * *

UNITED STATES PATENT AND TRADEMARK OFFICE
CERTIFICATE OF CORRECTION

| | | |
|---|---|---|
| PATENT NO. | : 12,033,918 B2 | Page 1 of 1 |
| APPLICATION NO. | : 17/258993 | |
| DATED | : July 9, 2024 | |
| INVENTOR(S) | : Kang et al. | |

It is certified that error appears in the above-identified patent and that said Letters Patent is hereby corrected as shown below:

On the Title Page

Item (73) Assignee, Please change "LG Electronics Inc." to --LG Magna e-Powertrain Co., Ltd., Incheon (KR)--.

Signed and Sealed this
First Day of October, 2024

Katherine Kelly Vidal
*Director of the United States Patent and Trademark Office*